United States Patent [19]

Deppe et al.

[11] Patent Number: 5,018,157
[45] Date of Patent: May 21, 1991

[54] VERTICAL CAVITY SEMICONDUCTOR LASERS

[75] Inventors: Dennis G. Deppe; Russell D. Dupuis, both of Austin, Tex.; Erdmann F. Schubert, New Providence, N.J.

[73] Assignee: AT&T Bell Laboratories, Murray Hill, N.J.

[21] Appl. No.: 472,145

[22] Filed: Jan. 30, 1990

[51] Int. Cl.⁵ .................................................. H01S 3/19
[52] U.S. Cl. .................................... 372/45; 357/4; 357/17
[58] Field of Search ....................... 372/43, 45, 96, 99; 357/4, 17

[56] References Cited
FOREIGN PATENT DOCUMENTS 0081888  5/1985  Japan ....................................... 372/45
0097684  5/1985  Japan ....................................... 372/45
0046996  2/1989  Japan ....................................... 372/45
0264285 10/1989  Japan ....................................... 372/45

Primary Examiner—Georgia Epps
Attorney, Agent, or Firm—D. I. Caplan

[57] ABSTRACT

In a vertical cavity laser, such as an InP based vertical laser, the energy bandgap in the active region can be made equal to or larger than the bandgap in a semiconductor mirror stack by virtue of degenerate doping in the stack sufficient to suppress electronic band-to-band optical absorption. For example, the active region of an InP based laser can be lattice-matched GaInAs, GaInAsP, or a multiple quantum well structure composed of layers of InP and GaInAs—with the mirror stack composed of alternating layers of InP and degenerately doped n-type lattice-matched GaInAs or GaInAsP.

18 Claims, 1 Drawing Sheet

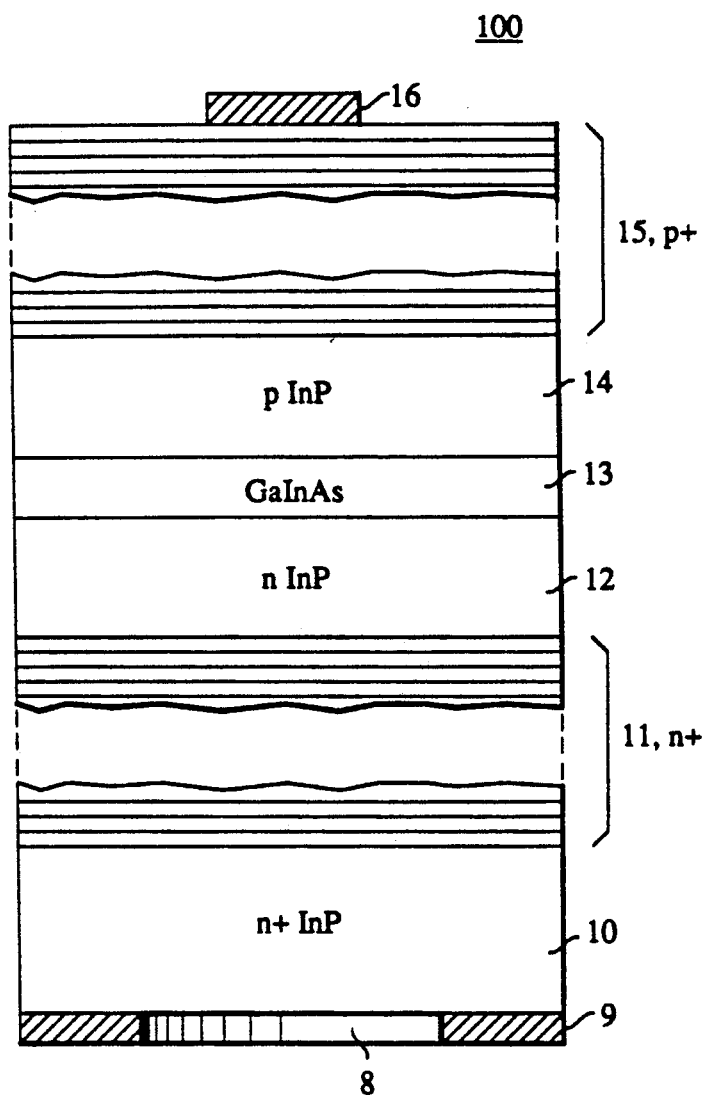

VERTICAL CAVITY SEMICONDUCTOR LASERS

TECHNICAL FIELD

This invention relates to semiconductor lasers and more particularly to those which have vertical cavities for the emission of light (optical radiation) through a major ("horizontal") surface of the semiconductor.

BACKGROUND OF THE INVENTION

In prior art, the structure of one useful form of semiconductor lasers falls into the category of vertical cavity (or simply "vertical") lasers. In a vertical laser, there is an active region which includes a planar pn junction. Typically the plane of this pn junction is parallel to a major surface of a semiconductor substrate body, the major surface of the substrate being considered arbitrarily to be horizontal. In a vertical laser, light is emitted from the top or the bottom (major) surface, or both, of the semiconductor body, a vertical optical cavity being created therein by virtue of semi-reflecting optical mirror(s) located on the top or bottom surface thereof, or both.

The structure of a vertical laser can be made circularly symmetric. Therefore, a vertical laser can have the advantage of relatively low astigmatism as compared with other lasers, such as "edge" lasers in which light is emitted from a side edge of the semiconductor body.

Typically, in a vertical laser each mirror(s) is formed by a quarter-wavelength stack, such as a stack formed by two semiconductors with differing refractive indices, which thus form a semiconductor superlattice. A vertical laser can be built as a double heterostructure, for example, by succesive epitaxial growth of the following semiconductor layers in spatial sequence upon a semiconductor substrate: the bottom mirror, a bottom optical cladding region, the active region, a top cladding region and the top mirror.

In an optically pumped semiconductor laser, optical radiation of wavelength(s) shorter than that (those) to be emitted by the laser is directed upon the laser to create an electronic population inversion. In an electrically pumped vertical cavity semiconductor laser, top electrodes are formed on the top major surface of the top mirror and on the bottom major surface of the substrate, for electrical pumping. Many such vertical lasers can be built on a single such substrate, as by trench or other isolation, in such a way that the intensity of light—e.g., ON vs. OFF-emitted by each laser can be controlled by an electrical signal independently of all other lasers on the substrate. Thus, vertical lasers appear especially attractive for use in practical applications where more than one independently controllable source of light is desired. Typically the amount of light emitted by each such vertical laser is determined by the electrical current injected into the laser through the top electrode. Alternatively, many separate vertical lasers can be mass produced from the single substrate, as by masking and etching apart the individual lasers.

In prior art, the semiconductor substrates that have been used have been confined mostly to gallium arsenide or indium phosphide. Such lasers typically entail very near lattice-matching requirements of the double heterostructure, in order to achieve the high quality (low defect density) epitaxial growth needed for the desirably low optical absorption and high quantum efficieny of light emission.

In the case of gallium arsenide (GaAs) based lasers, the required lattice-matching can be achieved with the ternary semiconductor aluminum gallium arsenide ($Al_xGa_{1-x}As$ with x anywhere from zero to unity), because of the special property of sufficiently close lattice-matching between the binary semiconductor GaAs and the ternary semiconductor $Al_xGa_{1-x}As$ for any x between zero and unity. On the other hand, in order to achieve reasonably large optical reflectivity at each interface between contiguous layers in the mirror stack, the refractive indices and hence the chemical compositions of the two layers should be reasonably disparate, in order to avoid the need for unduly large numbers of layers in the mirror stack—i.e., a thicker structure which is undesirable because of increased optical absorption. Moreover, the active region—the bandgap of which determines the wavelength of the emitted light—is made with a semiconductor, such as GaAs or lattice-matched InGaAs, having a bandgap which is always less than those of the cladding regions and (any layers in) the mirrors, in order to avoid unwanted optical absorption in the cladding or the mirrors. The bandgap of AlAs is about 2.2 eV (corresponding to a vacuum wavelength of about 0.55 μm) which is greater than the bandgap of about 1.4 eV (0.9 μm) for GaAs. Consequently, a GaAs laser emits a wavelength of less than about 0.9 μm.

In the cae of InP based lasers, longer wavelengths may be possible, namely, as long as 1.7 μm. In such lasers, lattice-matching can be achieved, for example, with the ternary semiconductor $Ga_{0.47}In_{0.53}As$ ("lattice-matched GaInAs") or with quaternary semiconductors, such as $Ga_xIn_{1-x}As_yP_{1-y}$ or $Al_xGa_yIn_{1-x-y}As$. Again, in prior art the bandgap in the active region has been always selected to be less than those of the cladding regions and mirrors, to minimize unwanted optical absorption in the cladding and mirrors, and thereby minimize the threshold current for lasing (laser operation). Again also, in order to achieve reasonably large reflectivity at each interface between two contiguous layers in the mirror stack, the chemical compositions of the two layers have been selected to be, as they should be, reasonably disparate to achieve a reasonably large difference in their refractive indices and henced a reasonably large reflectivity at their interfaces. However, such a requirement in turn entails undesirably high optical absorption, whereby the threshold for lasing is undesirably high. For example, in an InP based laser in which the active region is composed of lattice-matched GaInAs, the cladding regions of InP, and the mirror(s) of alternating quarter wavelength layers of lattice-matched GaInAs and InP—optical absorption in the GaInAs mirror layers in the mirror stack is undesirably high, so that the threshold for lasing is also undesirably high. Although this absorption can be reduced by merely adding phosphorus to the lattice-matched GaInAs in the mirror layers and simultaneously changing the atomic ratio of Ga/In in the mirror layers to form lattice-matched $Ga_xIn_{1-x}As_yP_{1-y}$—as is described, for example, in a paper entitled "GaInAsP Surface Emitting Laser ($\lambda = 1.4$ μm, 77K) with Heteromultilayer Bragg Reflector," published in *Electronics Letters*, Vol. 21, No. 7, pp. 303–304 (28 Mar. 1985)—such a procedure would undesirably decrease the reflectivity at the interfaces between the (original) InP layers and the resulting $Ga_xIn_{1-x}P_{1-y}$, whereby (because of the resulting smaller difference in refractive indices) undesirably larger numbers of quarter-wavelength layers in the mirror stacks would be required to maintain the desired high total reflectivity of the stack. In turn, these larger numbers of layers in the mirror stack would undesirably increase the optical absorption of the laser structure per optical pass through the structure. Moreover, this absorption problem would be even more severe if in an effort to achieve a shorter wavelength optical output (larger energy per photon) the active region would be made of a multiple quantum well structure which would generate optical radiation of such shorter wavelength.

It would therefore be desirable to have an InP based laser structure which mitigates this problem.

SUMMARY OF THE INVENTION

The foregoing problem in an InP based laser is mitigated by degenerately doping at least one of the mirror layers, for example, the n-type lattice-matched GaInAs layers in the GaInAs-InP mirror stack in conjunction with an active region likewise composed of lattice-matched GaInAs. The n-type degenerate doping reduces the band-to-band absorption and at the same time does not adversely affect opitcal reflectivety in the mirror, at least in the case of n-type lattice-matched GaInAs as we have found by experiment.

More generally the invention involves a vertical cavity laser comprising an active region which has a bandgap energy (energy per emitted photon) that is equal to or greater than the bandgap of at least one of the layers in the mirror stack, which is degenerately doped. Even though, in general, doping of the layer in the mirror stack tends to reduce its bandgap and hence increase its optical absorption and thus increase the lasing threshold, the degenerate doping called for in this invention more than compensates this tendency by virtue of filling up the lower portion of the conduction band with charge carriers and hence increasing the required energy per photon for absorption by band-to-band electronic transition, whereby there is a resulting decreased optical absorption in the mirror stack and hence a resulting lowering of laser threshold, so long as the energy per photon is not too great—i.e., so long as the bandgap of the active region is not larger than the enhanced band-to-band energy required in the mirror stack for optical absorption.

Thus this invention can also be practiced with degenerately doped lattice-matched quaternary GaInAsP or with multiple quantum wells of GaInAs and InP in the active region, whereby the energy per emitted photon is increased (wavelength is decreased), and in such cases the n-type mirror stack can have alternating layers of InP and degenerately doped lattice-matched n-type quaternary GaInAsP (at some sacrifice of reflectivity, and hence increased absorption in the mirror stack, but not as much as in prior art—because less added phosphorus is needed in the mirror stack to maintain a desired reduced optical absorption, and hence the desirably high reflectivity at the quaternary-binary semiconductor interfaces is reduced by a smaller amount than in prior art).

BRIEF DESCRIPTION OF THE DRAWING

This invention together with its features, characteristics, and advantages may be better understood from the following detailed description when read in conjunction with the drawing in which the FIGURE is a cross-section view of a vertical cavity semiconductor laser in accordance with a specific embodiment of the invention.

Only for the sake of clarity, the drawing is not to scale.

DETAILED DESCRIPTION

As shown in the FIGURE, a laser 100 includes an n-type InP substrate body 10 upon whose bottom surface is located a metallic ohmic contact layer 9. This contact layer 9 has an apertue 8 therein for enabling the exit of light from the laser 100. The InP body is heavily doped with donor impurities, such as sulfur or tin, typically to a concentration of approximately 1E18 per cubic centimeter—i.e., $1 \times 10^{18}$ per cubic centimeter. Upon the top surface of the InP body 10 is located a mirror stack composed of alternating quarter-wave layers of InP and $Ga_{0.47}In_{0.53}As$, i.e., lattice-matched GaInAs. The lattice-matched layers of GaInAs are degenerately doped, advantageously to a concentration of at least about 4E18 free carrier electrons per cubic centimeter furnished by donor impurities, such as sulfur or tin, in case of an active region which generates optical radiation having a vacuum wavelength equal to about 1.65 $\mu$m (energy per photon=0.7 eV), and advantageously to a concentration of at least 2E19 free carrier electrons per cubic centimeter, furnished by donor impurities such as sulfur or tin, for a vacuum wavelength of about 1.55 $\mu$m. The InP layers in the mirror stack are also doped, advantageously to a concentration of at least about 1E18 donor atoms per cubic centimeter both for the 1.65 $\mu$m wavelength case and for the 1.55 $\mu$m wavlength case. The purpose of doping these InP layers is to achieve reasonably good electrical conductivty through the stack.

Typically there are at least between about 10 to 20 spatial periods in the mirror stack 11, each period consisting of quarter-wavelength thick InP layer and a quarter-wavelength thick lattice-matched GaInAs layer.

On the top surface of the mirror stack 11 there is located an n-type InP optical cladding layer 12 on whose top surface is located the active region or layer 13 of p- or n-type lattice-matched GaInAs typically having a thickness of about 0.5 to 4 $\mu$m. The doping level in the cladding layer 12 is intermediate between those of the active layer 13 and the mirror stack 11. At any rate, the doping level in the cladding layer 12 is made suitable for that of a laser, typically about 1E17 to 5E17 per cubic centimeter.

Alternatively, the active layer 13 is formed by alternating ("multiple") quantum wall layers of InP and lattice-matched GaInAs. Typically in such a case the thickness of each of the InP layers is in the approximate range of 5 to 50 nm and that of each of the GaInAs layers is in the approximate range of 1 to 20 nm. Typically there are from one to 20 spatial periods of such multiple quantum well layers.

On the top surface of the active layer 13 there is located a p-type InP cladding layer 14 having a doping level suitable for that of a laser, typically about 1E17 to 5E17 per cubic centimeter.

On the top surface of the cladding layer 14 there is located a p-type mirror stack 15, which is optional and may be omitted. This p-type mirror stack 15 is composed of alternating quarter-wavelength layers of p-type InP and lattice-matched GaInAs. These layers have a sufficiently high doping level to achieve reasonably good electrical conductivity, typically about 1E18 to 2E18 acceptor impurity atoms per cubic centimeter for the InP layers and about 1E18 to 5E18 per cubic centimeter for the GaInAs layers.

On a limited portion of the top surface of the p-type mirror 15 (or the cladding layer 14, in the absence of the p-type mirror 15) there is located a metallic mirror ohmic contact 16, typically gold or silver—which reflects about 95% to 98% of the incident optical radiation generated in the active layer 13. It should be noted that the mirror stack 15 may not on its own have sufficient optical reflectivity for achieving a good optical activity, and that the metal mirror 16 supplies added reflectivity needed for the cavity.

In order to fabricate the laser 100, the semiconductor layers 11, 12, 13 and 14 can be grown upon the body 10 by such known methods as metal organic vapor phase epitaxy (MOVPE), also known as metal organic chemical vapor deposition (MOCVD), or by molecular beam epitaxy (MBE), or by hydride vapor phase epitaxy (VPE). The ohmic contact layer 9 can be fabricated by such known techniques as evaporation followed by photolithography to achieve a desirable annular shape for example. The metal mirror contact 16 can be fabricated by such known techniques as evaporation of the mirror metal, followed by masking and etching as known in the art.

It should be understood that many lasers can be fabricated on a single substrate by first forming all the semiconductor and metal layers all the way across the surfaces of the InP body 10, forming by etching the individual metal mirror contacts 16 (one for each laser), etching the apertures 8 in the ohmic contacts 9, and then further masking and etching (or cleaving) apart the individual lasers. Alternatively, many lasers can remain integrated on the same body 10 and at the same time be mutually isolated by trench or mesa isolation techniques, as known in the art.

Although the invention has been described in detail with reference to a specific embodiment, various modifications can be made without departing from the scope of the invention. For example, in order to increase the energy (decrease the wavelength) per photon of the emitted light, the active region can contain phosphorus in an amount to form lattice-matched quaternary GaInAsP. In such a case, as well as in other cases where the energy per photon is increased—as by using a multiple quantum well containing phosphorus (InP) in the active region as described above, or by any other scheme— then n-type degenerated doped quaternary lattice-matched GaInAsP may advantageously be used in the mirror stack instead of ternary lattice-matched GaInAs.

In all events, in accordance with the invention, the bandgap of the active region is equal to or larger than that of the ternary or quaternary layer in the mirror, but laser threshold is reduced by virtue of degenerated doping of the mirror stack to suppress electronic band-to-band optical absorption.

What is claimed is:

1. In a vertical cavity semiconductor laser an active region which generates optical radiation and a mirror stack which reflects the radiation, the stack containing a plurality of spatial periods each of which consists of essentially a quarter-wavelength layer of first semiconductor material and a quarter-wavelength layer of second semiconductor material which is different from the first, the layer of second material having energy a bandgap that is equal to or less than the energy per photon of the radiation, and the layer of second material containing a concentration of impurities sufficient to render the second material degenerate and significantly less absorptive of the radiation.

2. A laser according to claim 1 in which the first material is InP, and the second material and the active region are both lattice-matched GaInAs.

3. A laser according to claim 1 in which the first material is InP and the second material is lattice-matched GaInAsP.

4. In a vertical cavity laser:
  (a) an InP semiconductor body having essentially planar top and bottom major surfaces;
  (b) a mirror stack located on the top surface of the body, the stack being composed of a plurality of alternating layers of n-type InP and lattice-matched n-type GaInAs or GaInAsP;
  (c) an active region composed essentially of lattice-matched GaInAs or lattice-matched GaInAsP, or quantum wells of InP and lattice-matched GaInAs or lattice-matched GaInAsP, the active region separated from the top surface of the mirror stack by an n-type optical cladding layer of InP, the doping level of the active region being less than that of the cladding layer, and the doping level of the cladding layer being less than that of the lattice-matched GaInAs or GaInAsP in the mirror stack, the layers of GaInAs or GaInAsP in the mirror stack having doping levels that are sufficiently high to render them degenerately doped.

5. A vertical cavity laser in accordance with claim 4 further comprising:
  an ohmic contact layer, located on the bottom major surface of the body, having an aperture therein to enable the exit therethrough of optical radiation generated in the active region.

6. A vertical cavity laser in accordance with claim 5 further comprising:
  a p-type optical cladding layer of InP located on the top surface of the active region.

7. A vertical cavity laser in accordance with claim 6 further comprising:
  another ohmic contact layer, located on the top surface of the p-type optical cladding layer.

8. A vertical cavity laser in accordance with claim 7 further comprising:
  a p-type optical cladding layer of InP located on the top surface of the active region.

9. A vertical cavity laser in accordance with claim 4 in which the doping level in the degenerate GaInAs or GaInAsP in the mirror stack is at least about 1E19 per cubic centimeter.

10. A vertical cavity laser in accordance with claim 5 in which the doping level in the degenerate GaInAs or GaInAsP in the mirror stack is at least about 1E19 per cubic centimeter.

11. A vertical cavity laser in accordance with claim 6 in which the doping level in the degenerated GaInAs or GaInAsP in the mirror stack is at least about 1E19 per cubic centimeter.

12. A vertical cavity laser in accordance with claim 7 in which the doping level in the degenerate GaInAs or GaInAsP in the mirror stack is at least about 1E19 per cubic centimeter.

13. A vertical cavity in acordance with claim 8 in which the doping level in the degenerate GaInAs OR GaInAsP in the mirror stack is at least about 1E19 per cubic centimeter.

14. A vertical cavity laser in accordance with claim 4 in which the doping level in the degenerate GaInAs or GaInAsP in the mirror stack is at least about 1E20 per cubic centimeter.

15. A vertical cavity laser in accordance with claim 5 in which the doping level in the degenerate GaInAs or GaInAsP in the mirror stack is at least about 1E20 per cubic centimeter.

16. A vertical cavity laser in accordance with claim 6 in which the doping level in the degenerate GaInAs or GaInAsP in the mirror stack is at least about 1E20 per cubic centimeter.

17. A vertical cavity laser in accordance with claim 7 in which the doping level in the degenerate GaInAs or GaInAsP in the mirror stack is at least about 1E20 per cubic centimeter.

18. A vertical cavity laser in accordance with claim 8 in which the doping level in the degenerate GaInAs or GaInAsP in the mirror stack is at least about 1E20 per cubic centimeter.

* * * * *

UNITED STATES PATENT AND TRADEMARK OFFICE
CERTIFICATE OF CORRECTION

PATENT NO. : 5,018,157

DATED : 5/21/91

INVENTOR(S) : D. G. Deppe, R. D. Dupois, E. F. Schubert

It is certified that error appears in the above-identified patent and that said Letters Patent is hereby corrected as shown below:

Column 6, line 1, "energy a" should be --a energy--.
Column 7, line 1, after cavity insert --laser--.
Column 7, line 1, "acordance" should be --accordance--.
Column 7, line 2, "OR" should be --or--.

Signed and Sealed this

Twenty-third Day of February, 1993

Attest:

STEPHEN G. KUNIN

Attesting Officer      Acting Commissioner of Patents and Trademarks